United States Patent
Hahn et al.

(10) Patent No.: US 12,414,417 B2
(45) Date of Patent: Sep. 9, 2025

(54) OPTOELECTRONIC DEVICE WITH GLASS CARRIER AND METHOD OF MANUFACTURE

(71) Applicant: ams-OSRAM International GmbH, Regensburg (DE)

(72) Inventors: Berthold Hahn, Hemau-Hohenschambach (DE); Matthias Goldbach, Pentling (DE); Georg Bogner, Hainsacker/Lappersdorf (DE)

(73) Assignee: ams-OSRAM International GmbH, Regensburg (DE)

( * ) Notice: Subject to any disclaimer, the term of this patent is extended or adjusted under 35 U.S.C. 154(b) by 516 days.

(21) Appl. No.: 17/798,855

(22) PCT Filed: Feb. 9, 2021

(86) PCT No.: PCT/EP2021/053053
§ 371 (c)(1),
(2) Date: Aug. 10, 2022

(87) PCT Pub. No.: WO2021/160596
PCT Pub. Date: Aug. 19, 2021

(65) Prior Publication Data
US 2023/0102780 A1 Mar. 30, 2023

(30) Foreign Application Priority Data
Feb. 11, 2020 (DE) .................. 10 2020 103 433.4

(51) Int. Cl.
*H10H 20/85* (2025.01)
*H01L 25/075* (2006.01)
(Continued)

(52) U.S. Cl.
CPC ....... *H10H 20/855* (2025.01); *H01L 25/0753* (2013.01); *H10H 20/8511* (2025.01);
(Continued)

(58) Field of Classification Search
CPC ........... H10H 20/855; H10H 20/85112; H10H 20/8582; H10H 20/872; H10H 20/0363; H10H 20/882; H01L 25/0753
(Continued)

(56) References Cited

U.S. PATENT DOCUMENTS 7,072,096 B2 7/2006 Holman et al.
9,490,398 B2 11/2016 Oyamada et al.
(Continued)

FOREIGN PATENT DOCUMENTS

CN 105280795 A 1/2016
CN 106023822 A * 10/2016 ........... G02B 5/3033
(Continued)

OTHER PUBLICATIONS

Cite the machine translation Tamaki H (EP-3125310-A1).*
(Continued)

*Primary Examiner* — Phuc T Dang
(74) *Attorney, Agent, or Firm* — Hauptman Ham, LLP

(57) ABSTRACT

An optoelectronic device includes a glass carrier, at least one light-scattering layer applied to the glass carrier, and at least one surface-emitting component in a chip size package with an emission surface and a surface facing away from the emission surface having a first and a second contact pad. The emission surface is arranged on the at least one light-scattering layer by way of an adhesive. At least one contact line contacts the second contact pad of the at least one surface-emitting component and extends along a side surface of the at least one surface-emitting component adjacent to the second contact pad in a direction of the glass carrier.
(Continued)

Figure 1:
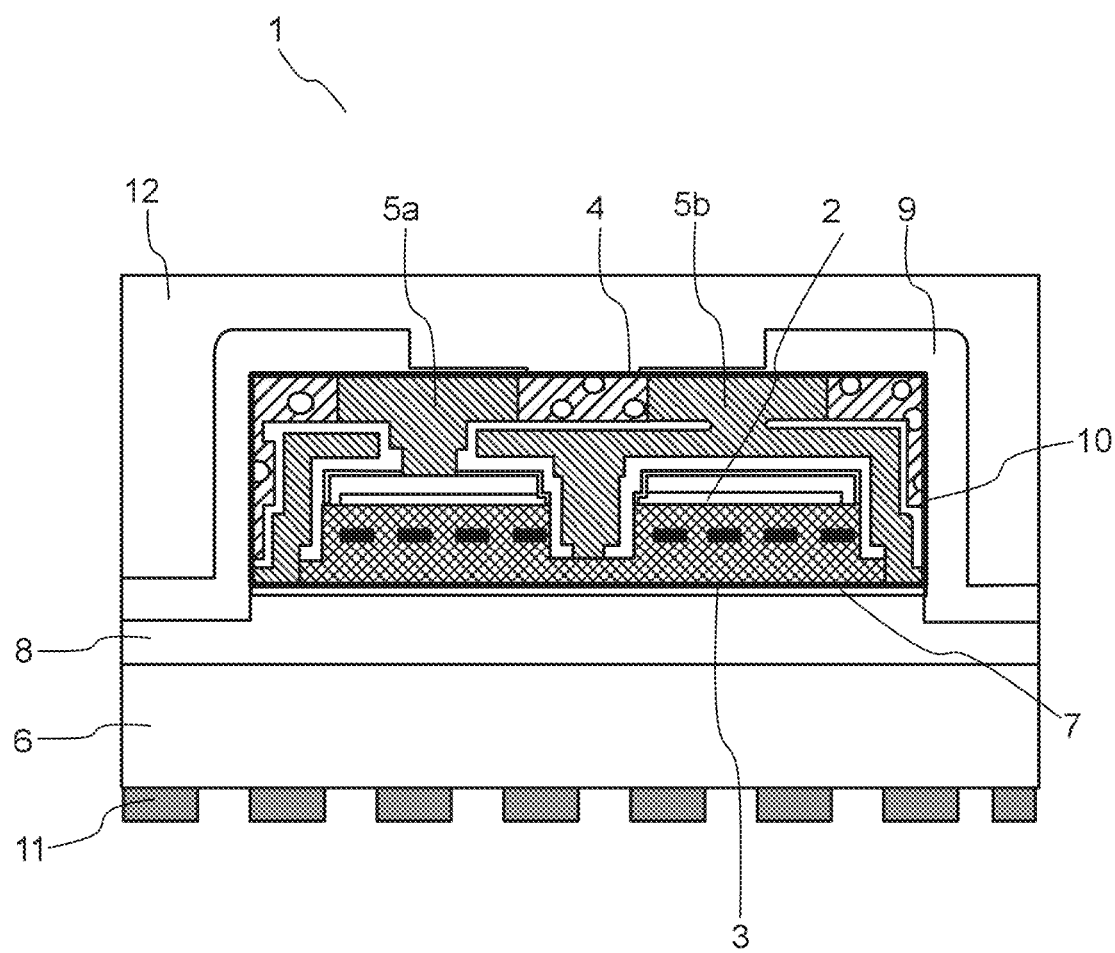

A light-shaping structure is arranged on a surface of the glass carrier facing away from the surface-emitting component.

19 Claims, 10 Drawing Sheets

(51) Int. Cl.
*H10H 20/851* (2025.01)
*H10H 20/855* (2025.01)
*H10H 20/856* (2025.01)
*H10H 20/858* (2025.01)
*H10H 20/01* (2025.01)
*H10H 20/80* (2025.01)

(52) U.S. Cl.
CPC ...... *H10H 20/856* (2025.01); *H10H 20/8582* (2025.01); *H10H 20/0363* (2025.01); *H10H 20/872* (2025.01); *H10H 20/882* (2025.01)

(58) Field of Classification Search
USPC .......................................................... 257/98
See application file for complete search history.

(56) References Cited

U.S. PATENT DOCUMENTS

| | | |
|---|---|---|
| 2006/0290253 A1 | 12/2006 | Yeo et al. |
| 2013/0140592 A1 | 6/2013 | Lee et al. |
| 2017/0141278 A1 | 5/2017 | Hamaguchi et al. |
| 2018/0119931 A1* | 5/2018 | Bower .................. F21V 7/04 |

FOREIGN PATENT DOCUMENTS

| | | | |
|---|---|---|---|
| CN | 109997073 A * | 7/2019 | ............ G02B 5/02 |
| DE | 10 2013 107 862 A1 | 1/2015 | |
| DE | 10 2016 118 990 A1 | 4/2018 | |
| EP | 3125310 A1 * | 2/2017 | ........... H01L 33/005 |
| EP | 2 657 994 B1 | 2/2019 | |
| WO | WO-2014127584 A1 * | 8/2014 | ........... H05K 1/0209 |
| WO | 2015/011590 A1 | 1/2015 | |
| WO | 2015/036231 A1 | 3/2015 | |
| WO | 2018/202685 A1 | 11/2018 | |

OTHER PUBLICATIONS

Cite the machine translation Yasu K (CN-106023822).*
Cite the machine translation Wu Y (CN-109997073-A).*
Cite the machine translation Gong Z (WO-2014127584).*
International Search Report issued on May 10, 2021, for corresponding International Patent Application No. PCT/EP2021/053053, along with an English translation.
Written Opinion issued on May 10, 2021, for corresponding International Patent Application No. PCT/EP2021/053053.

* cited by examiner

OPTOELECTRONIC DEVICE WITH GLASS CARRIER AND METHOD OF MANUFACTURE

CROSS REFERENCE TO RELATED APPLICATION

This application is a National Stage of International Application No. PCT/EP2021/053053, filed on Feb. 9, 2021, which designates the United States and was published in Europe, and which is based upon and claims priority to German Patent Application No. DE 10 2020 103 433.4, filed on Feb. 11, 2020 in the German Patent Office. Both of the aforementioned applications are hereby incorporated by reference in their entireties.

The present invention relates to an optoelectronic device having at least one surface-emitting component disposed on a glass carrier, and a method of manufacturing the same.

LED light sources with high efficiency, small dimensions and low coupling losses in narrow light guides are required for display lighting. The thickness of such a light guide can be less than 0.8 mm, for example.

Furthermore, light sources are also required to directly illuminate LCD displays and also to be highly efficient and highly homogeneous over the entire display area despite being only a few millimeters thick.

For the use of such light sources in automotive applications, they have to be coupled with a display or a light guide with a very high mechanical stability.

In current applications, so-called micro LEDs are usually used to illuminate LCD displays. However, the brightness of these LEDs is no longer sufficient for future applications that are also intended to enable three-dimensional display and for which efficiency optimization with polarization films, for example, is no longer possible. Similarly, it has not yet been possible to couple such LEDs with a light guide in accordance with the mechanical requirements in the automotive sector, since the requirements in the automotive sector are significantly higher than those in the consumer sector.

Accordingly, the present invention is based with the objective to provide an improved optoelectronic device which offers very high mechanical stability, in particular for use in the automotive sector, as well as high efficiency for very thin light guides.

The task is solved by an optoelectronic device having the features of claims 1 and 16. Embodiments and further embodiments of the invention are described in the dependent claims.

An optoelectronic device according to the invention comprises a glass carrier, at least one light-scattering layer arranged on the glass carrier and at least one surface-emitting device in chip-size package, which comprises an emission surface and a surface facing away from the emission surface with two contact pads. The emission face of the at least one surface emitting component is disposed on the light scattering layer by means of an adhesive. Further, the optoelectronic device comprises at least one contact line contacting the second contact pad of the at least one surface emitting component and extending along a side surface of the optoelectronic device adjacent to the second contact pad towards the glass carrier, and a light shaping structure arranged on the surface of the glass carrier facing away from the optoelectronic device.

The at least one light-scattering layer can have conversion properties in addition to the light-scattering properties or also conversion properties. For this purpose, the light-scattering layer can be formed, for example, from a polysiloxane matrix or from a similar material with converter particles, in particular color converter particles.

The light-shaping structure can be formed by a polarization filter or other beam-shaping gratings (DBR) with a periodic patterning with a width of, for example, 100 nm to 300 nm. The width of the patterning should be related to a wavelength of the light emitted from the surface emitting component.

The surface emitting component is, for example, an LED (light emitting diode) formed as a chip size package and has first and second contact pads on the surface opposite the emitting surface. In one aspect, the LED is configured to emit light having a wavelength in the blue region. However, it is equally possible for the LED to emit light having a wavelength in the red, green, or other range. Depending on the application, the blue light emitted by an LED can, for example, be converted into light of a different wavelength, e.g., red or green, by an additional converter material applied to the LED.

The at least one contact line of an optoelectronic device contacts the second contact pad and subsequently extends along a side surface of the surface-emitting device adjacent to the second contact pad toward the glass carrier. In a mirrored manner, the optoelectronic device may include another contact line contacting the first contact pad and extending along a side surface of the surface emitting component adjacent to the first contact pad toward the glass carrier. The contact lines may further each extend outwardly from the surface emitting component on the light scattering layer and/or the glass carrier to electrically contact the optoelectronic device from the outside.

In one aspect, the contact lines are applied to the contact pads of the surface emitting component and at least one of the glass carrier and the light scattering layer using a so-called PICOS process (Planar Interconnect-On-Substrate). In the first step, a seed layer, in particular of a titanium-copper alloy, is applied to the side of the surface-emitting device facing away from the emission surface and at least one of the glass carrier and the light-scattering layer for this purpose. A photoresist is then applied to the seed layer and the photoresist is patterned so that areas of the seed layer are exposed. The exposed areas of the seed layer are then electroplated and copper titanium is electrodeposited onto the exposed areas of the seed layer. The areas of photoresist remaining due to patterning and the underlying seed layer are then removed. This procedure "encloses" the surface-emitting component with the contact lines, so that it is possible to ensure the required mechanical stability of the optoelectronic device with the aid of these PICOS contacts.

In addition to the PICOS contact lines for increasing mechanical stability, the optoelectronic device can have a white, in particular reflective, filler material layer that envelops the at least one surface-emitting device and the at least one contact line on the side of the surface-emitting device facing away from the emission surface. In this way, however, not only additional mechanical stability of the optoelectronic device can be ensured, but the light emitted by the surface-emitting component leaves the optoelectronic device almost exclusively in the direction of the emission surface and not in the direction of the side surfaces and the surface of the surface-emitting component opposite the emission surface.

Light-scattering material or light-scattering particles can additionally be introduced into the glass layer of the optoelectronic device. Thus, in addition to the light-scattering properties of the light-scattering layer, a beam homogenization of the radiation emitted by the surface-emitting device in the direction of the emission surface can be achieved in the glass carrier.

Among other things, this has the advantage that the light emitted by the at least one surface-emitting device is homogenized by at least the light-scattering layer and, if applicable, the glass layer, and thus the light-forming structure is well illuminated.

A light guide can additionally be arranged on the side of the light-forming structure facing away from the glass carrier, which guides the light emitted by the at least one surface-emitting component along the longitudinal propagation direction of the surface-emitting component. The more homogeneously the emitted light falls on the light-forming structure, the more homogeneously the light guide can then also be illuminated.

By applying such a light guide, a flat light source can be generated in a special way for so-called backlighting of, for example, displays or for daytime running lights or car taillights.

For such applications, a light guide in particular should not exceed a thickness of 0.8 mm, which is why the surface emitting components in one aspect should not exceed a width of 0.3 mm.

Further, it is convenient for the surface emitting component to have a height of ≤0.5 mm and a length≤1 mm. Among other reasons, this is to make the entire optoelectronic device as flat as possible and to ensure easy assembly of the device.

In this regard, in one aspect, the glass carrier is also thin, in particular only a few tenths of a mm thick. This can ensure that the optoelectronic device is designed to be as flat as possible.

The adhesive between the at least one surface emitting component and the light scattering layer may have various designs or shapes. In some embodiments, the adhesive may be limited to the cross-sectional area of the surface emitting component and in further embodiments, the adhesive extends beyond the cross-sectional area of the surface emitting component. This may result, among other things, from the adhesive being forced outwardly, for example, when the surface emitting component is pressed onto the light scattering layer, thereby forming an "accumulation" of adhesive at the outer edges of the surface emitting component. As a result, an "accumulation" of adhesive may be formed at the edges of the surface-emitting device, for example, in the form of a ramp formed from the side surfaces of the surface-emitting device toward the light-scattering layer.

The ramp may be formed steeply or less steeply, and may extend to the side surface of the optoelectronic device or may flatten to the side surface of the optoelectronic device. However, the shape of the adhesive "accumulation" can, for example, also be rounded, in the form of a drop or in the form of a raised bar parallel to the light-scattering layer.

The degree of adhesive "accumulation" can be related, for example, to the amount of adhesive applied and/or the pressure when pressing the surface-emitting component onto the light-scattering layer and/or the viscosity of the adhesive and/or the surface properties of the surface-emitting component and/or the surface properties of the light-scattering layer and/or other process parameters such as room temperature.

Furthermore, the optoelectronic device may comprise a heat dissipation layer arranged on the side of the surface emitting component facing away from the emission surface. The heat dissipation layer may be metallized to best dissipate the power dissipated as heat by the surface emitting component. However, a part of the filler material layer is arranged between the contact lines and the heat dissipation layer, so that the contact lines and the heat dissipation layer are electrically separated from each other and thus insulated.

At least two, but also 2 to 100 and in particular 2 to 2000, of the optoelectronic devices described above can together form an arrangement. The at least two optoelectronic devices are thereby arranged adjacent to each other in longitudinal direction and the at least one contact line of the respective optoelectronic device runs from the second contact pad of a first surface emitting component along the glass carrier between the at least two adjacent surface emitting components to the first contact pad of a second surface emitting component, so that these are electrically connected in series.

In such an arrangement, both the glass carrier, the light-scattering layer, the light-forming structure, and the filler material layer may be formed together and, accordingly, may extend uninterruptedly between the junctions of the at least two optoelectronic devices.

The adhesive between two adjacent surface emitting components of such an arrangement can at least partially fill this space. The adhesive "accumulation" can be formed, for example, in the form of a raised bar parallel to the light-scattering layer, in the form of a U, i.e. with a depression in the adhesive between the adjacent surface-emitting components, or in the form of two ramps starting in each case from the adjacent surface-emitting components. The at least one contact line of the at least two optoelectronic devices can thereby run between the two surface-emitting components on the upper side of the adhesive.

Furthermore, the present application comprises a method for manufacturing an optoelectronic device or arrangement as described above. The method comprises providing a glass carrier having at least one light scattering layer thereon. The method further comprises providing at least two surface emitting components in a chip size package, each having an emitting surface and a surface opposite to the emitting surface, each having a first contact pad and a second contact pad. The emission surfaces of the at least two surface emitting components are bonded to the light scattering layer. Subsequently, the PICOS process described above is applied.

The method may further comprise applying a light-shaping structure to the surface of the glass carrier facing away from the optoelectronic devices, and separating the surface-emitting devices in the form of strips. The strips may comprise only one row of surface emitting components or individual surface emitting components.

Further, the method may comprise applying a light guide to the side of the light forming structure opposite the glass carrier, the light guide directing the light emitted from the at least one singulated surface emitting component along the longitudinal propagation direction of the surface emitting component.

Figure 2:
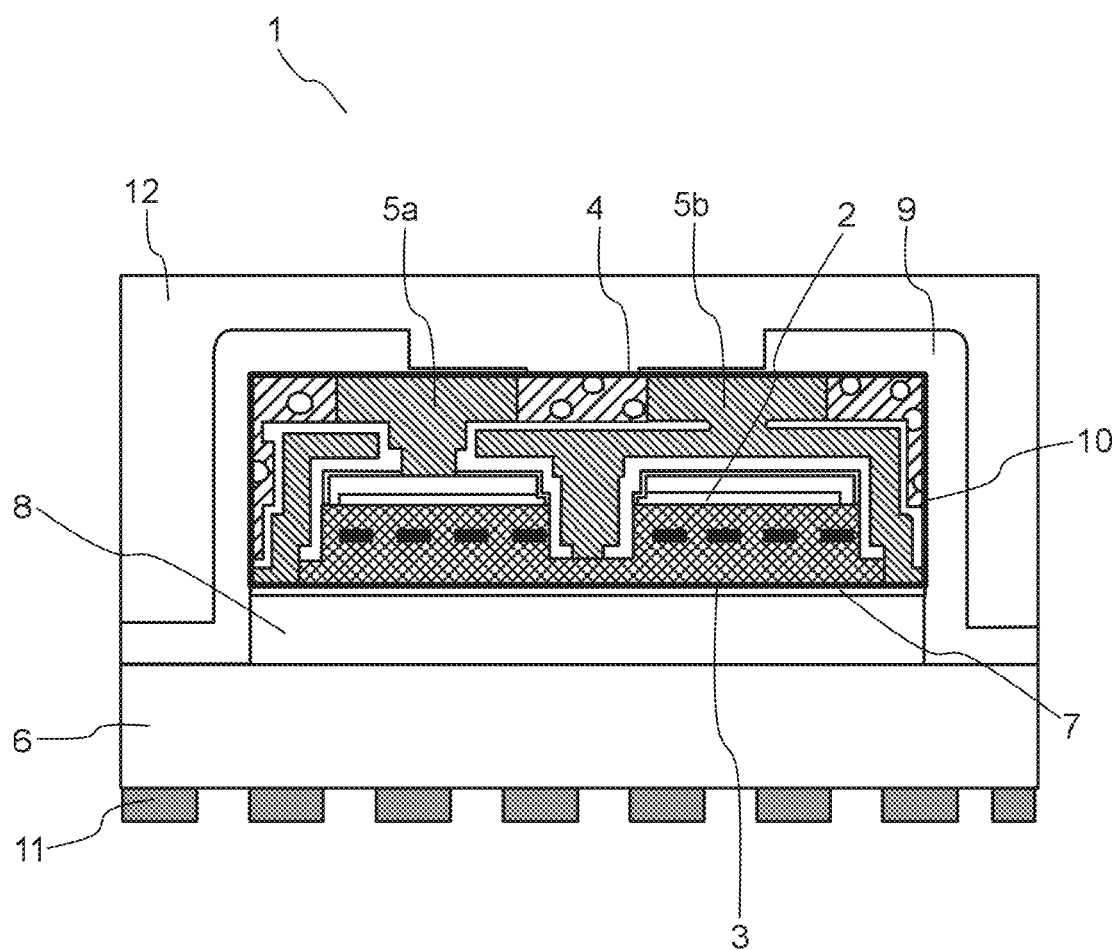
Figure 3:
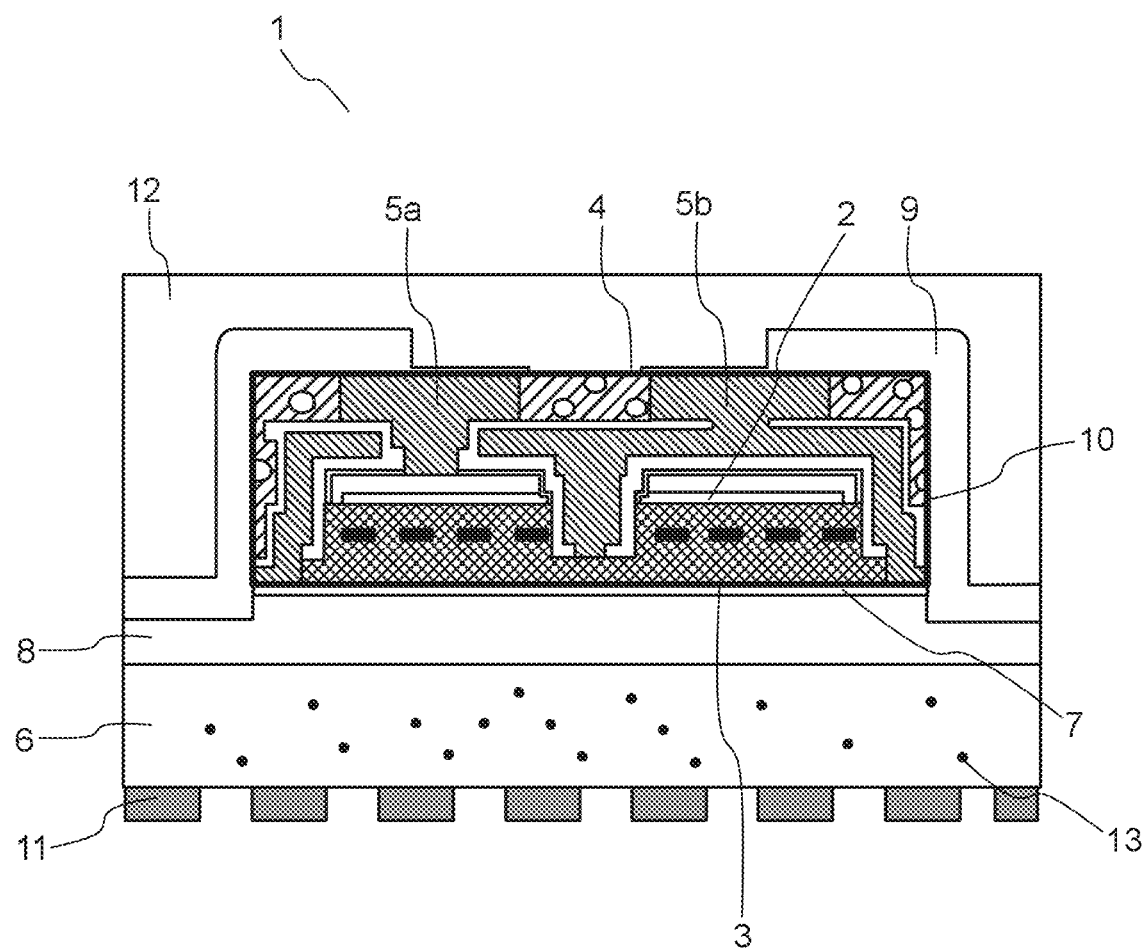
Figure 4A:
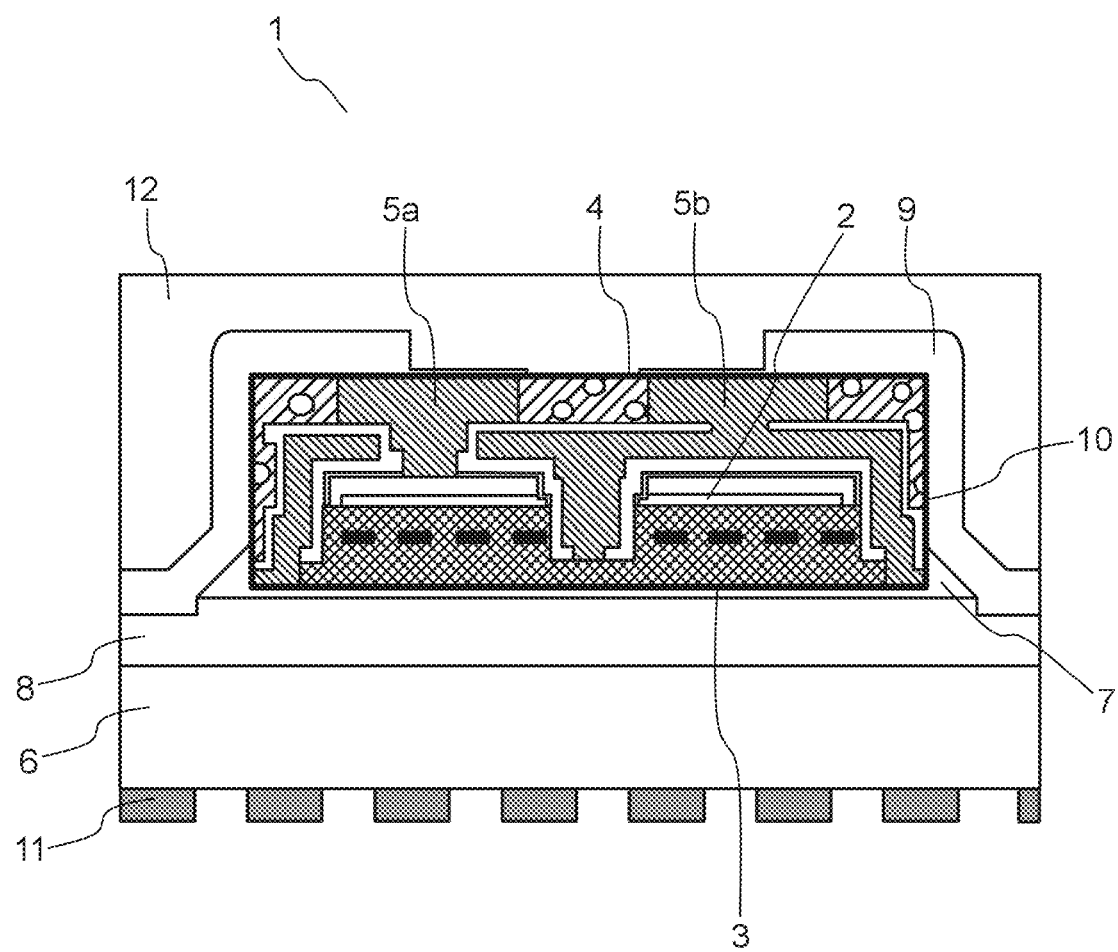
Figure 4B:
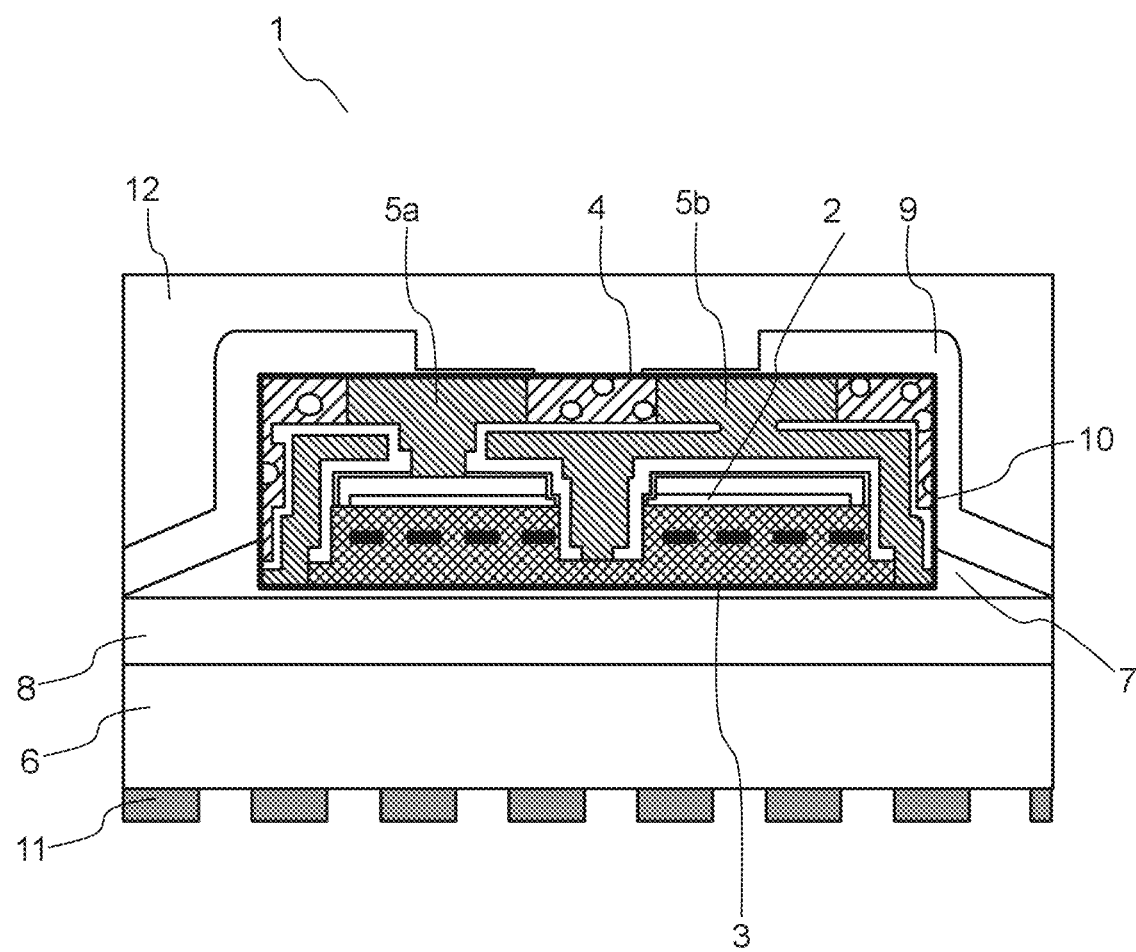
Figure 5:
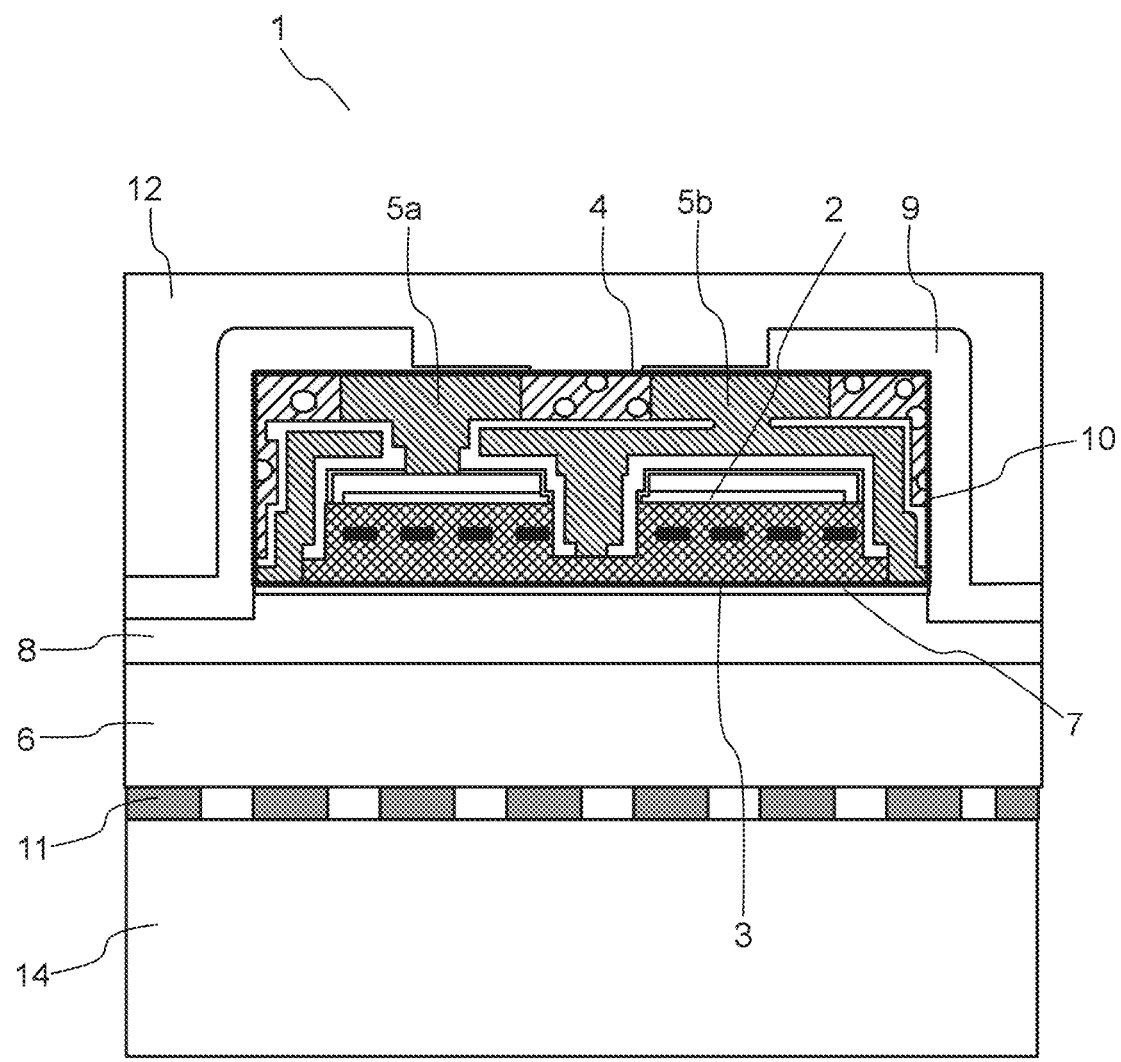
Figure 6:
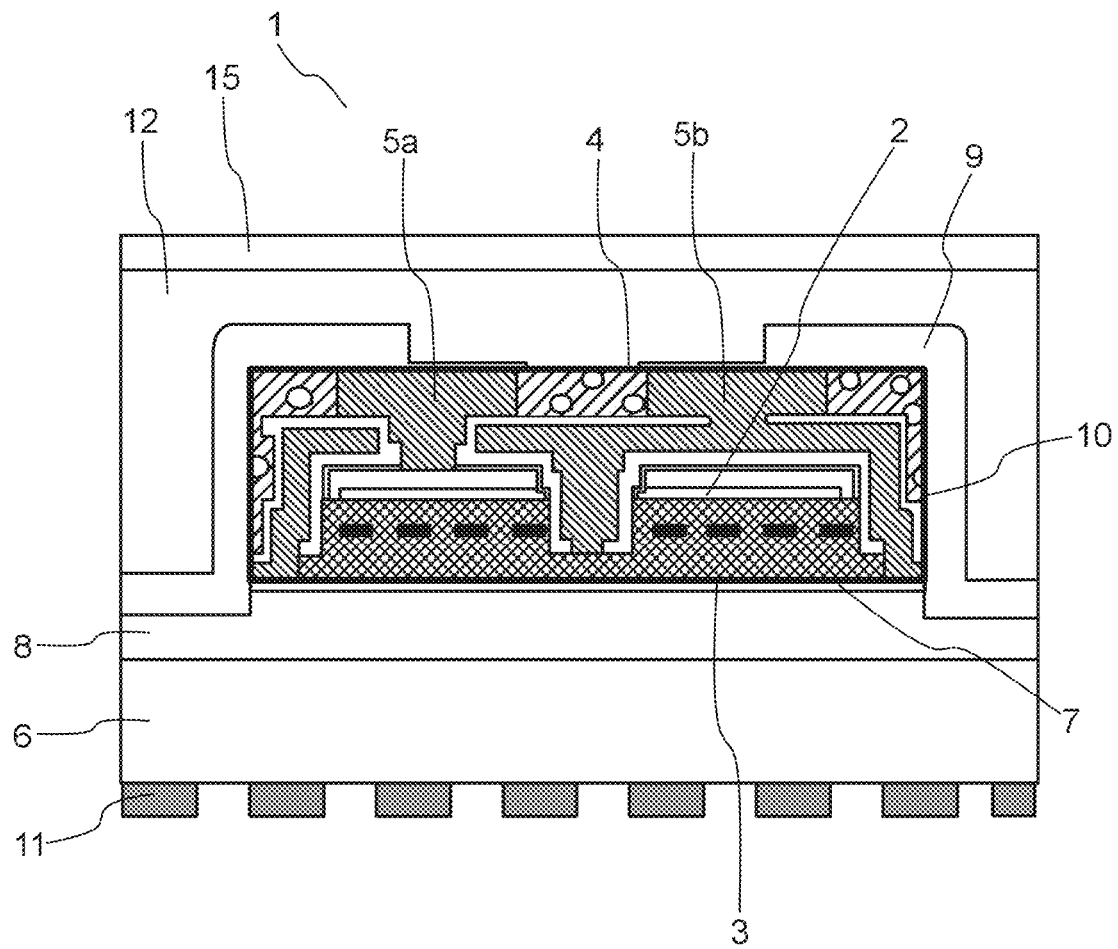
Figure 7:
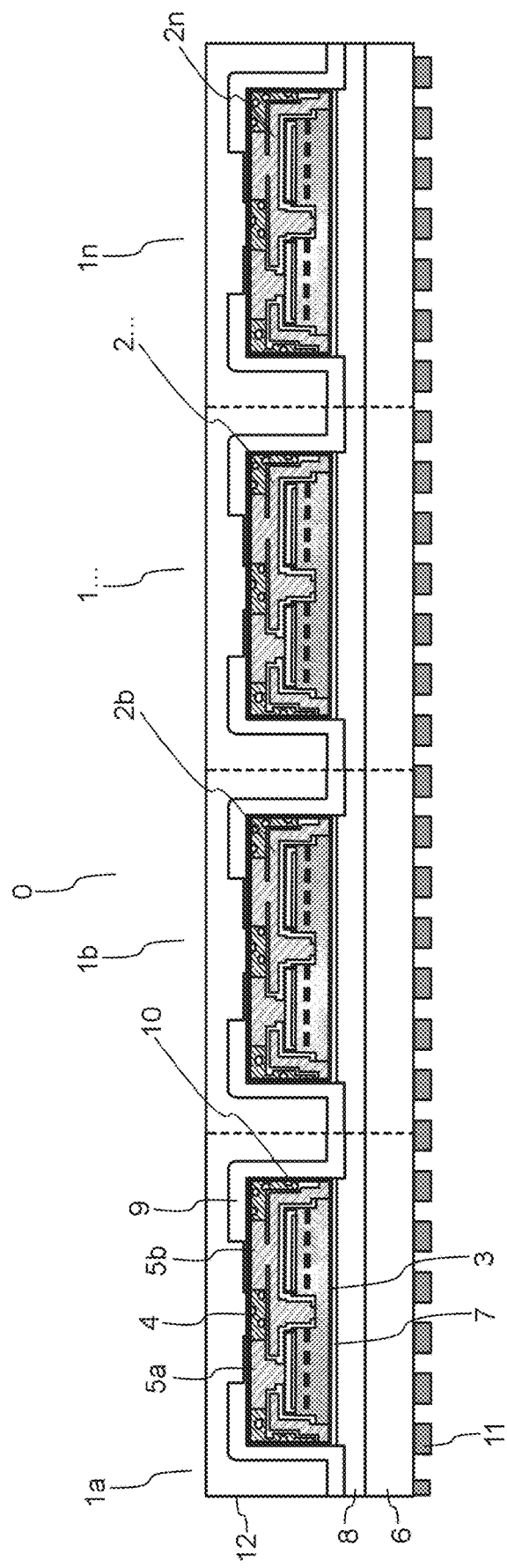
Figure 8:
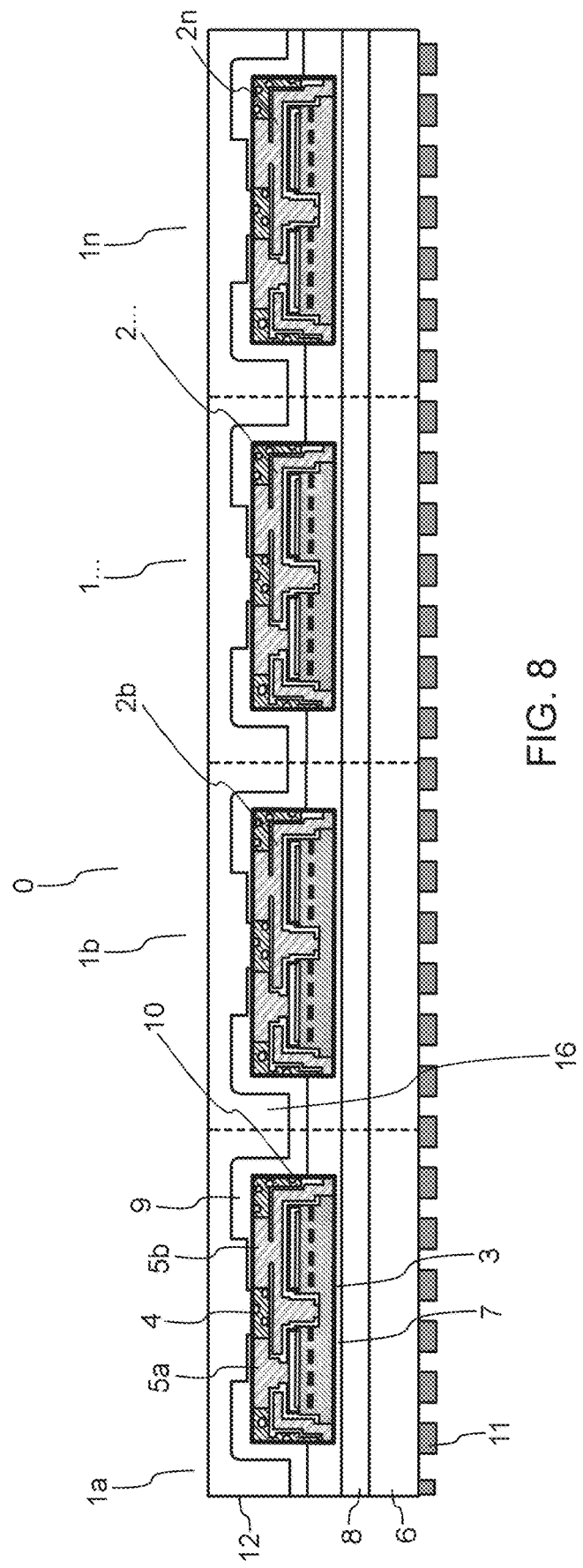
Figure 9:
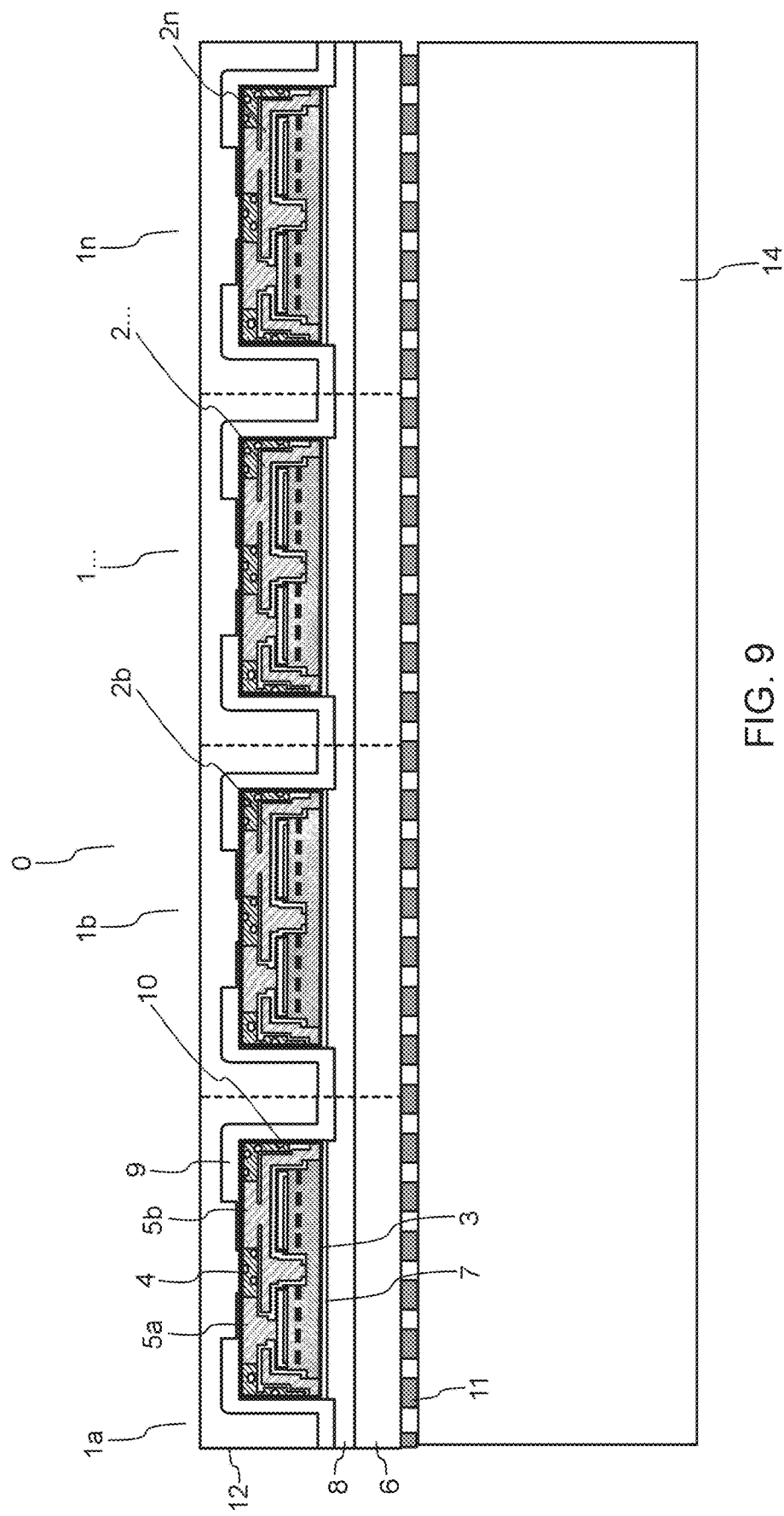

In the following, embodiments of the invention are explained in more detail with reference to the accompanying drawings. They show, schematically in each case, FIG. 1 an embodiment of the optoelectronic device according to the invention;

FIG. 2 a further embodiment of the optoelectronic device in which a light-scattering layer is assigned to the optoelectronic component in certain areas;

FIG. 3 a further embodiment of the optoelectronic device in which the glass carrier additionally contains particles;

FIGS. 4A and 4B further embodiments of the optoelectronic device with different versions of the adhesive;

FIG. 5 a further embodiment of the optoelectronic device with an additionally applied light guide;

FIG. 6 another embodiment of the optoelectronic device with an additionally applied heat dissipation layer;

FIG. 7 an arrangement of at least two optoelectronic devices;

FIG. 8 a further arrangement of at least two optoelectronic devices with a further version of the adhesive;

FIG. 9 a further arrangement of at least two optoelectronic devices with an additionally applied light guide.

FIG. 1 shows an optoelectronic device (1) comprising a glass carrier (6), a light-scattering layer (8) and a surface-emitting component (2) with an emission surface (3) and a surface (4) facing away from the emission surface. This light-scattering layer (8) is applied to the glass carrier (6), and the emission surface (3) of the surface-emitting component (2) is in turn arranged on this layer by means of a transparent adhesive (7). The adhesive (7) is arranged between the surface-emitting component (2) and the light-scattering layer (8) in such a way that it does not extend beyond the cross-sectional area of the surface-emitting component (2) as far as possible. However, it may also be possible, as shown in more detail in the following embodiments, for the adhesive (7) to extend beyond the cross-sectional area of the surface-emitting component (2). This may result, among other things, from the fact that the adhesive (7) is pressed outwardly, for example, when the surface-emitting component (2) is pressed onto the light-scattering layer (8), thereby forming an "accumulation" of adhesive at the outer edges of the surface-emitting component (2).

The surface-emitting component (2) in FIG. 1 is, for example, of the chip-size package type and comprises a first (5*a*) and a second (5*b*) contact pad on the surface (4). The structure of the surface-emitting component (2) corresponds in a particular way to that of a conventional LED (light-emitting diode) formed as a chip-size package. The LED comprises an upper p-doped first layer, a lower n-doped second layer and an active zone between the two layers. The first layer is contacted, for example, via the first contact pad (5*a*) and the second layer is contacted via the second contact pad (5*b*) and the vias connected thereto and isolated from the first contact pad (5*a*). In one aspect, the LED is configured to emit light having a wavelength in the blue region. However, it is equally possible for the LED to emit light having a wavelength in the red, green, or other range. Depending on the application, the blue light emitted by an LED can, for example, be converted into light of a different wavelength, e.g. red or green, by an additional converter material applied to the LED.

Furthermore, the optoelectronic device (1) comprises a contact line (9) which makes contact with the second contact pad (5*b*) and runs along a side surface (10) of the surface-emitting component (2) adjacent to the second contact pad (5*b*) in the direction of the glass carrier (6). Here, the side surface (10) is considered to be the outer surface of the surface-emitting component (2) that is perpendicular to the surface (4) in the drawing plane of FIG. 1, or that is perpendicular to the surface (4) to the greatest possible extent. In a mirrored manner, the optoelectronic device (1) may comprise another contact line contacting the first contact pad (5*a*) and extending along a side surface of the surface-emitting component (2) adjacent to the first contact pad (5*a*) in the direction of the glass support (6). The contact line (9) may contact the second contact pad (5*b*) in areas as shown in FIG. 1, or cover the entire contact pad (5*b*). Furthermore, it is also possible for the contact line (9) to have changes in cross-sectional area in the region of the contact pad (5*b*) and thus in the region of the contact surface. The contact lines may further each extend outwardly from the surface-emitting device on the light-scattering layer (8) in order to be able to electrically contact the optoelectronic device (1) from the outside.

The contact lines are applied to the contact pads of the surface-emitting component (2) in a special way with the aid of a so-called PICOS process (planar interconnect-on-substrate). First, a seed layer, in particular of a titanium-copper alloy, is applied to the side of the surface emitting component (2) facing away from the emission surface (3) and at least one of the glass carrier (6) and the light scattering layer (8). A photoresist is then applied to the seed layer and the photoresist is patterned so that areas of the seed layer are exposed.

The exposed areas of the seed layer are then electroplated and the copper of the titanium-copper alloy can grow in these areas. The areas of photoresist remaining due to patterning and the underlying seed layer are then removed. This procedure ensures that the surface-emitting component (2) is "enclosed" by the contact lines, so that it is possible to guarantee the required mechanical stability of the optoelectronic device (1) with the aid of these PICOS contacts.

The light-scattering layer (8) applied to the glass carrier (6) is in particular a smooth and hard phosphor coating which is formed, for example, from a so-called PIX (polysiloxane matrix) or a similar material with introduced particles. The particles introduced can, for example, be converter particles or color converter particles, so that the light-scattering layer (8) comprises additional conversion properties.

A light-shaping structure (11) is additionally arranged on the surface of the glass carrier (6) opposite the light-scattering layer (8). This light-shaping structure (11) can be formed, for example, by polarization filters or other beam-shaping gratings (DBR) with a periodic structuring with a width of, in particular, 100 nm to 300 nm. Through the light-shaping structure (11), the light emitted by the surface-emitting components can be shaped and reflectively coupled into an additional light guide, for example.

In order to ensure that the light emitted by the surface-emitting component (2) leaves the optoelectronic device (1) almost exclusively in the direction of the emission surface (3), it can be further advantageous to embed the surface-emitting component (2) and the contact lines in a, for example, white, in particular reflective, filler material layer (12). This can ensure that virtually no light escapes from the optoelectronic device (1) in the direction of the side surfaces and the surface (4) of the surface-emitting component (2) opposite the emission surface (3). Another advantage of the filler material layer (12) may be an increased mechanical stability of the optoelectronic device (1).

FIG. 2 shows a further example of an optoelectronic device (1). In contrast to the optoelectronic device (1) shown in FIG. 1, the light-scattering layer (8) does not form a continuous layer on the glass carrier (6), but is formed only in the region of the cross-sectional area of the surface-emitting component (2). Accordingly, a light-scattering layer (8) is associated with the optoelectronic component (2) in areas. In contrast to FIG. 1, the contact line (9) therefore does not extend as far as the light-scattering layer (8), but runs along the side surface (10) of the surface-emitting component (2) as far as the glass carrier (6) and along the glass carrier (6) in its longitudinal direction of propagation.

In contrast to the optoelectronic device (1) in FIGS. 1 and 2, the optoelectronic device (1) in FIG. 3 shows that additional light-scattering material or light-scattering particles (13) can be introduced into the glass carrier (6). Thus, in addition to the light-scattering properties of the light-scattering layer (8), a beam homogenization of the radiation emitted by the surface-emitting component (2) in the direction of the emission surface (3) can be achieved in the glass carrier (6).

FIG. 4A and FIG. 4B show exemplary two further embodiments of an optoelectronic device (1) with different versions of the adhesive (7). In both figures, the adhesive (7) extends beyond the cross-sectional area of the surface emitting component (2). This may result, among other things, from the fact that the adhesive (7) is pressed outwardly, for example, when the surface-emitting component (2) is pressed onto the light-scattering layer (8), thereby forming an "accumulation" of adhesive at the outer edges of the surface-emitting component (2). In the case shown, this results in an "accumulation" of adhesive (7) at the edges of the surface-emitting component (2) in the form of a ramp formed from the side surfaces of the surface-emitting component (2) toward the light-scattering layer (8). The ramp shown in FIG. 4A is steeper than the ramp shown in FIG. 4B and does not extend to the side surface of the optoelectronic device (1), whereas the ramp shown in FIG. 4B extends to the side surface of the optoelectronic device (1).

However, the shape of the adhesive "accumulation" is not necessarily in the form of a ramp, but can also be rounded, in the form of drops or in the form of a raised bar parallel to the light-scattering layer (8).

The expression of the adhesive "build-up" may be related, for example, to the amount of adhesive (7) applied and/or the pressure when the surface-emitting component (2) is pressed onto the light-scattering layer (8) and/or the viscosity of the adhesive (7) and/or the surface condition of the surface-emitting component (2) and/or the surface condition of the light-scattering layer (8) and/or other process parameters such as room temperature.

In FIG. 4A and FIG. 4B, in contrast to the previous embodiments, the contact line (9) extends correspondingly from the surface (4) of the surface-emitting component (2) opposite the emission surface (3), along the side surface (10) of the surface-emitting component (2), on the adhesive "accumulation" toward the glass carrier (6), and toward the outer surface of the optoelectronic device in the longitudinal direction of propagation of the glass carrier (6).

In contrast to the optoelectronic device (1) in FIG. 1, the optoelectronic device (1) in FIG. 5 shows a further example of an optoelectronic device (1) which additionally has a light guide (14). This is arranged on the surface of the light-forming structure (11) facing away from the glass carrier. The light guide (14) is designed in such a way that it guides the light emitted by the surface-emitting component (2) along the longitudinal propagation direction of the surface-emitting component (2) in a particular manner.

By applying such a light guide, a flat light source can be generated in a special way for so-called backlighting of, for example, displays or for daytime running lights or car taillights.

For such applications, a light guide in particular should not exceed a thickness of 2 mm or in particular 1 mm or most especially 0.8 mm, for which reason the surface emitting components (2) should not exceed a corresponding width of 0.9 mm or in particular 0.6 mm or most especially 0.3 mm. Furthermore, it is convenient that the surface emitting component (2) comprises a height of ≤0.5 mm and a length≤1 mm. This is, among other things, due to the fact that the entire optoelectronic device (1) is designed to be as flat as possible and to ensure easy assembly of the device.

The glass carrier (6) is also thin, in particular only a few tenths of a mm thick. This ensures that the optoelectronic device (1) is as flat as possible.

In accordance with the example of an optoelectronic device (1) shown in FIG. 6, the optoelectronic device (1) can comprise, in addition to the optoelectronic device (1) shown in FIG. 1, a heat dissipation layer (15) above the surface (4) of the surface-emitting component (2) opposite the emission surface (3). The heat dissipation layer (15) may be metallized or formed of a metal to dissipate power losses generated as heat by the surface emitting component (2). As shown in the figure, a part of the filler material layer (15) is arranged between the contact lines and the heat dissipation layer (15) so that they are electrically separated from each other and thus insulated.

FIG. 7 shows an arrangement (0) with at least two optoelectronic devices (1a to 1n) corresponding to the optoelectronic devices (1) shown in FIGS. 1 to 6. The at least two optoelectronic devices (1a to 1n) are arranged adjacent to one another in the longitudinal direction. The contact line (9) of a respective optoelectronic device (1a to 1n) runs from the second contact pad (5b) of its surface-emitting component (2a) on the light-scattering layer (8) along the glass carrier (6) between two respective adjacent surface-emitting components (2a and 2b) to the first contact pad (5a) of the adjacent surface-emitting component (2b), whereby the at least two optoelectronic devices (1a and 1b) are electrically connected in series.

n is to be understood as a natural number from 2 to infinity, in particular from 2 to 100 and especially from 2 to 2000. Accordingly, the number n results in an arrangement of n series-connected optoelectronic devices (1a to 1n), each of which is electrically interconnected via a contact line (9).

Both the glass carrier (6), the light-scattering layer (8), the light-forming structure (11) and the filler material layer (12) are formed in a particular way in one piece and correspondingly uninterrupted between the transitions of the at least two optoelectronic devices (1a to 1n).

The arrangement (0) can extend not only in the longitudinal direction of the drawing plane of FIG. 7, but also perpendicularly to the drawing plane of FIG. 7, so that, for example, a plurality of rows of optoelectronic devices (1a to 1n) connected in series results on a wafer. This wafer can then be separated in any size in the form of a multiple of the optoelectronic devices (1a to 1n) in order to use the optoelectronic devices (1a to 1n), for example, as an area light source. It is also possible to separate the series-connected optoelectronic devices (1a to 1n) into narrow strips of only one series of series-connected optoelectronic devices (1a to 1n) each and to arrange such a series on an additional waveguide (14) as shown in FIG. 9.

In this regard, the light guide (14) is configured to guide, in one aspect, the light emitted from the surface emitting components (2a to 2n) along the longitudinal propagation direction of the series connected optoelectronic devices (1a to 1n).

By applying such a light guide, a flat light source can be generated in a special way for so-called backlighting of, for example, displays or also for daytime running lights or car taillights.

As already explained in the embodiments of the optoelectronic device (1) in FIGS. 4A and 4B, the adhesive (7) can extend beyond the cross-sectional area of the surface-emitting components (2a to 2n) and, in the present embodiment of FIG. 8, at least partially fill the space between two adjacent surface-emitting components (2a to 2n). This can result, among other things, from the fact that the adhesive (7) is pressed outwardly, for example, when the surface-emitting components (2a to 2n) are pressed onto the light-scattering layer (8), thereby forming an "accumulation" of adhesive on the outer edges of the surface-emitting components (2a to 2n).

However, the shape of the adhesive "accumulation" is not necessarily, as shown in FIG. 8, in the form of a raised bar parallel to the light-scattering layer (8), but can also be in the form of a U, i.e. with a depression in the adhesive (7) between the adjacent surface-emitting components (2a to 2n), or for example in the form of two ramps starting in each case from the adjacent surface-emitting components (2a to 2n).

The degree of adhesive "accumulation" can be related, for example, to the amount of adhesive (7) applied and/or the pressure when pressing the surface-emitting components (2a to 2n) onto the light-scattering layer (8) and/or the viscosity of the adhesive (7) and/or the surface properties of the surface-emitting components (2a to 2n) and/or the surface properties of the light-scattering layer (8) and/or other process parameters such as room temperature.

As in FIGS. 4A and 4B, the contact line (9) runs from the surface (4) of the surface-emitting components (2a to 2n) opposite the emission surface (3), along the side surface (10) of the surface-emitting components (2a to 2n), on the adhesive "accumulation" in the direction of the glass carrier (6) and towards the adjacent optoelectronic device (1a to 1n) in the longitudinal direction of spread of the glass carrier (6). In a mirrored manner, the contact line (9) in the adjacent optoelectronic device (1a to 1n) runs on the adhesive "accumulation", along the side surface of the surface-emitting devices (2a to 2n) opposite the side surface (10) up to the surface (4) of the surface-emitting devices (2a to 2n) opposite the emission surface (3) to the first contact pad (5a).

LIST OF REFERENCE SIGNS 0 arrangement
1, 1a, 1b, 1 . . . , 1n optoelectronic device
2, 2a, 2b, 2 . . . , 2n surface-emitting device
3 emission area
4 surface facing away from the emission surface
5a, 5b contact pad
6 glass carrier
7 adhesive
8 light scattering layer
9 contact line
10 side surface
11 light forming structure
12 filler layer
13 light scattering particles
14 light guide
15 heat dissipation layer

The invention claimed is:

1. An optoelectronic device comprising:
a glass carrier,
at least one light-scattering layer applied to the glass carrier, and
at least one surface-emitting component in a chip size package with an emission surface and a surface facing away from the emission surface comprising a first and a second contact pad, wherein
the emission surface is arranged on the at least one light-scattering layer by way of an adhesive;
at least one contact line contacts the second contact pad of the at least one surface-emitting component and extends along a side surface of the at least one surface-emitting component adjacent to the second contact pad in a direction of the glass carrier; and
a light-shaping structure is arranged on a surface of the glass carrier facing away from the surface-emitting component.

2. The optoelectronic device according to claim 1, wherein the at least one light-scattering layer comprises conversion properties.

3. The optoelectronic device according to claim 1, wherein the at least one light-scattering layer is formed of a polysiloxane matrix with color converter particles.

4. The optoelectronic device according to claim 1, wherein the light-shaping structure comprises a beam-shaping grating.

5. The optoelectronic device according to claim 1, wherein the at least one contact line (is formed by a Planar Interconnect-On-Substrate contact.

6. The optoelectronic device according to claim 1, wherein a filler material layer envelops the at least one surface-emitting component and the at least one contact line on the surface of the at least one surface-emitting component facing away from the emission surface.

7. The optoelectronic device according to claim 1, wherein the at least one surface-emitting component is configured to emit light in a blue wavelength range.

8. The optoelectronic device according to claim 1, wherein the glass carrier comprises light-scattering particles.

9. The optoelectronic device according to claim 1, wherein the at least one surface emitting component has a height of ≤0.5 mm, a length ≤1 mm, and a width of <0.3 mm.

10. The optoelectronic device according to claim 1, wherein the light-shaping structure comprises a periodic patterning with a width of 100 nm to 300 nm.

11. The optoelectronic device according to claim 1, wherein the adhesive forms a ramp or elevation between the side surface of the at least one surface-emitting component and the glass carrier or the at least one light-scattering layer on which the at least one contact line runs.

12. The optoelectronic device according to claim 1, wherein a heat dissipation layer is arranged on the surface of the at least one surface-emitting component facing away from the emission surface.

13. The optoelectronic device according to claim 1, wherein a light guide is arranged on a side of the light-shaping structure facing away from the glass carrier, and the light guide guides the light emitted by the at least one surface-emitting component along the longitudinal propagation direction of the at least one surface-emitting component.

14. An arrangement comprising at least two optoelectronic devices according to claim 1, wherein
the at least two optoelectronic devices comprise a first optoelectronic device and a second optoelectronic device arranged longitudinally adjacent to each other, and
the at least one contact line of the first optoelectronic device is interconnected with the at least one contact line of the second optoelectronic device along the glass carrier between the at least one surface-emitting component of the first optoelectronic device and the at least one surface-emitting component of second optoelectronic device, electrically connecting the at least two optoelectronic devices in series.

15. The arrangement according to claim 14, wherein
a space between the at least one surface-emitting component of the first optoelectronic device and the at least one surface-emitting component of the second optoelectronic device is partially filled by the adhesive, and
at least one of the at least one contact line of the first optoelectronic device or the at least one contact line of the second optoelectronic device runs on the upper side of the adhesive between the first optoelectronic device and the second optoelectronic device.

16. A method of manufacturing an optoelectronic device, the method comprising:
providing a glass carrier having at least one light-scattering layer thereon;
providing at least two surface-emitting components in a chip-size package each having an emission surface and a surface facing away from the emission surface, each having a first and a second contact pad;
bonding the emission surfaces of the at least two surface-emitting components to the at least one light-scattering layer;
applying a seed layer to the surface of the at least two surface-emitting components facing away from the emission surface and at least one of the glass carrier and the light-scattering layer;
applying a photoresist to the seed layer;
structuring the applied photoresist so that areas of the seed layer are exposed;
electroplating the exposed areas of the seed layer; and
removing the areas of photoresist remaining due to patterning and an underlying nucleated layer.

17. The method of manufacturing the optoelectronic device according to claim 16, further comprising:
applying a light-shaping structure to a surface of the glass carrier facing away from the at least two surface-emitting components.

18. The method of manufacturing the optoelectronic device according to claim 17, further comprising:
separating the at least two surface-emitting components in the form of strips comprising only one row of surface-emitting components or in the form of individual surface-emitting components.

19. The method of manufacturing the optoelectronic device according to claim 17, further comprising:
applying a light guide to a side of the light-shaping structure facing away from the glass carrier, wherein the light guide guides the light emitted by the at least two surface-emitting components or the light individually emitted by each of the at least two surface-emitting components along the longitudinal propagation direction of at least one of the at least two surface-emitting components.

* * * * *